United States Patent

Krivokapic

[11] Patent Number: 5,960,291
[45] Date of Patent: Sep. 28, 1999

[54] ASYMMETRIC CHANNEL TRANSISTOR AND METHOD FOR MAKING SAME

[75] Inventor: Zoran Krivokapic, Santa Clara, Calif.

[73] Assignee: Advanced Micro Devices, Inc., Sunnyvale, Calif.

[21] Appl. No.: 08/909,044

[22] Filed: Aug. 8, 1997

[51] Int. Cl.[6] ................................................. H01L 21/336
[52] U.S. Cl. ............................................................ 438/286
[58] Field of Search .................................... 438/286, 257, 438/264, 298, 774

[56] References Cited

U.S. PATENT DOCUMENTS

| | | | |
|---|---|---|---|
| 4,518,630 | 5/1985 | Grasser | 438/774 |
| 5,366,915 | 11/1994 | Kodama | 438/257 |
| 5,518,942 | 5/1996 | Shrivastava | 438/264 |
| 5,543,337 | 8/1996 | Yeh et al. | 438/264 |
| 5,578,509 | 11/1996 | Fujita | 438/286 |
| 5,624,859 | 4/1997 | Liu et al. | 438/298 |

OTHER PUBLICATIONS

S. Wolf anf R.N. Tauber. "Silicon Processing for the VLSI Era vol. 1–Process Technology." Lattice Press, Sunset Beach CA, USA. p. 191, No Month 1986.

Wolf "Silicon Processing for the VLSI Era vol. 3: The Submicron MOSFET", Lattice Press. Sunset Beach, CA, USA. pp. 421 and 496, No Month 1995.

Odanaka, et al., "Potential Design and Transport Property of 0.1–$\mu m$ MOSFET with Asymmetric Channel Profile," IEEE Transactions on Electron Devices, vol. 44, No. 4 (Apr. 1997).

*Primary Examiner*—Charles Bowers
*Assistant Examiner*—Craig Thompson
*Attorney, Agent, or Firm*—Fliesler, Dubb, Meyer & Lovejoy LLP

[57] ABSTRACT

A method for forming an asymmetrical channel transistor is disclosed. The method, in one embodiment, comprises the steps of: forming a gate stack on the surface of the substrate; forming a mask layer over the surface of the substrate and a portion of the gate stack, the mask layer having an opening over a portion of the gate stack on a first side of the gate stack; and implanting an impurity into the substrate at an angle relative to a line normal to the surface of the substrate in a range of about 5° to 40°.

19 Claims, 3 Drawing Sheets

ASYMMETRIC CHANNEL TRANSISTOR AND METHOD FOR MAKING SAME

BACKGROUND OF THE INVENTION

1. Field of the Invention

The invention relates to short-channel transistor devices, and particularly transistors having a channel length less than 0.25 μm.

2. Description of the Related Art

With the continuing quest to define and produce transistors having ever-smaller overall cell geometries that are capable of operating at increasing switching speeds, many variations on the conventional self aligned channel region have been attempted. For the purposes of this application, cell geometry is defined as the two-dimensional surface area required for implementing a single, integral active lodging element, typically an — or P-channel resistor or a pair of complementary transistors. Cell geometry can be distinguished from transistor geometry in that the latter refers to the three-dimensional structure of a single integral logic element.

Typically, MOSFET transistors are manufactured in a symmetrical fashion. That is, the semiconductor substrate has a gate stack formed thereon, whether the gate stack is a single polysilicon gate, or a floating gate design, and source or drain regions are thereafter implanted with a gate stack in place so that the source and drain regions are "self-aligned" to the gate stack. Variations of this technique include the lightly-doped drain (LDD) transistor wherein spacers are formed about the gate stack and lightly-doped regions are formed below the spacers and adjacent to the more heavily-doped source and drain regions in order to avoid device punch-through and other short-channel effects which are seen in transistor devices as the channel length of the devices approaches 0.35 μm or less.

As the miniaturization of MOSFETs continues, scaling of devices below the 0.25 μm regime, and in particular, below the 0.15 μm regime presents an entirely new set of challenges to the transistor designer.

One particular solution which has been explored with respect to sub-0.15 μm devices is the asymmetric channel device. In general, the asymmetric channel device is formed by using an angled implant of an impurity on the source side of the device while masking the drain side so that a portion of the implant underlies the gate stack forming a more lightly-doped region than the adjacent drain region.

In the quarter-micron regime, asymmetric n-channel MOSFET devices have been proposed to achieve high current drive-ability and hot-carrier reliability. In a paper by Odanaka, et al., entitled "Potential Design and Transport Property of 0.1-μm MOSFET with Asymmetric Channel Profile," IEEE Transactions on Electron Devices, Vol. 44, No. 4 (Apr. 1997), the authors describe the exploration of the relationship between device performance and transport property of a 0.1 μm n-channel MOSFET with an asymmetric channel profile through Monte Carlo device simulations and measured electrical characteristics.

The experimental device taught therein has a gate oxide thickness of 4 nanometers and a polysilicon gate height of 200 nanometers. Processing of the device is equivalent to that of a conventional symmetrical device, except that the $V_t$ channel implant, which is utilized to adjust the threshold voltage of the device, is performed by a threshold adjustment implantation with an orientation non-normal to the surface of the substrate after gate electrode formation. For such a channel implant, an 80 KeV $BF_2$ ion dose of $1 \times 10^{13}$ cm-2 is implanted with a tilt angle of 7°. Of note is that this implant is on the source side only of the devices, and no masking of the device during the $V_t$ implant is discussed. The reference teaches that the asymmetry of the lateral channel profile becomes weak as the $BF_2$ energy decreases. After gate electrode formation, arsenic ions with a dose of $1 \times 10^{14}$ cm-2 were implanted at an energy of 10 KeV to form shallow source/drain extensions. Subsequently, deep source/drain regions are formed with a high arsenic dose of $6 \times 10^{15}$ cm-2 at an energy of 40 KeV, followed by a rapid thermal anneal at 1,050° C. for ten seconds.

In a symmetrical short channel MOSFET, a number of implants are used to control the $V_t$ threshold voltage. In particular, a substrate will typically have formed thereon an epitaxial silicon layer overlying the bulk silicon layer of the semiconductor substrate.

A shallow implant of, for example, a P-type impurity such as boron or $BF_2$ will be implanted into the channel region wherein the device is to be formed. The energy of the implant will be in a range of about 10–30 KeV to a junction depth of about 100 μm.

Subsequently, a punch-through stop implant at an energy of about 40–100 KeV to a junction depth of about 0.25 μm will be made into the epitaxial silicon. This pushes dopants further down into the substrate and increases the resistance of the channel.

Finally, a third, approximately 200 KeV implant may be used in addition to form a deep punch-through stop implant at a depth of about 0.5 μm.

While the teachings of the Odanaka reference obviate the need for such multiple implants, little control over the implant process and the design and distribution of the implant concentration is disclosed.

SUMMARY OF THE INVENTION

The invention, roughly described, comprises a method for forming an asymmetrical channel transistor apparatus. Typically, the transistor will have a source and drain region, with a channel implant region below the surface of the gate structure.

The method, in one embodiment, comprises the steps of: forming a gate stack on the surface of the substrate; forming a mask layer over the surface of the substrate and a portion of the gate stack, the mask layer having an opening over a portion of the gate stack on a first side of the gate stack; and implanting an impurity into the substrate at an angle relative to a line normal to the surface of the substrate in a range of about 5° to 40°.

In one embodiment, the angle of implant is in a range of 20°–25°.

In a further embodiment, the invention comprises the steps of forming a second mask layer over the surface of the substrate at a portion of the gate stack, the second mask layer having an opening over a portion of the surface on the second side of the gate stack; and implanting an impurity into the substrate along a path normal to the surface of the substrate.

In yet another alternative embodiment, after the first angled implant, the method may include the steps of: depositing a conformal layer over the surface of the substrate and the gate stack; etching the conformal layer to form spacers; and implanting a source and drain region into the substrate by implanting an impurity into the substrate along a path normal to the surface of the substrate.

In further embodiments, the substrate may be rotated 90°, 180°, and 270° relative to the initial position of the substrate to allow angled implantation into the threshold region of the transistor using various mask structures for different orientations of devices on the substrate.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION OF THE PREFERRED EMBODIMENTS

Reference is now made in detail to the specific embodiments of the present invention, which illustrate the best mode presently contemplated by the inventor for practicing the invention. It should be recognized by one of average skill in the art that in the following description, the invention will be described with respect to the particular embodiments. Numerous details, for example, specific materials, process steps, and process parameters, will be set forth in order to provide a thorough understanding of the present invention. It will, however, be readily understood by one of average skill in the art that the specific details need not be employed to practice the present invention, and that the specific details of the particular processes or structures which would be readily known to one of average skill are not specifically presented in order not to unduly obscure the invention.

Figure 1:
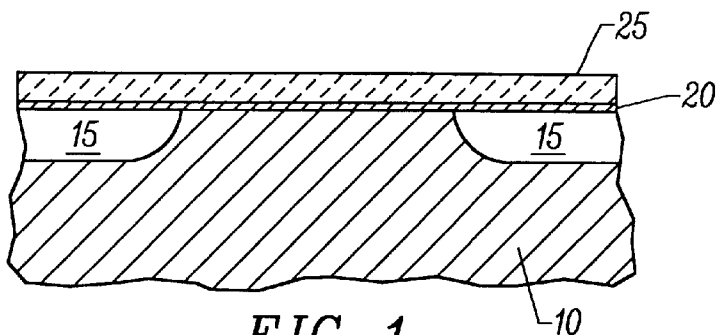
FIGS. 1 through 6 are cross-sections of a semiconductor substrate illustrating formation of an implant region in a transistor stack, in accordance with the method and apparatus of the present invention.

FIG. 1 illustrates a bulk semiconductor substrate 10 having formed thereon an oxide layer 20 and a polysilicon layer 25. Device isolation regions 15 are provided to isolate adjacent devices from each other. The isolation regions may be formed by a LOCOS process, or trench etch and oxidation process, in accordance with well-known techniques.

In the following description, formation of a single asymmetric channel device is illustrated. It should be recognized by one of average skill that the steps illustrated herein may be simultaneously performed on other areas of substrate 10 to form a number of devices.

Oxidation layer 20 will serve as the gate oxide layer for the transistor formed in the process of the present invention. Oxide layer 20 may be a thermally formed oxide layer having a thickness of about 1.5 to 3.0 nm by placing substrate 10 in an oxygen-containing atmosphere and heating the substrate at a temperature in the range of 750° C. to 850° C. for approximately five minutes.

Polysilicon layer 25 is deposited by any of a number of well-known conventional processes, including low pressure chemical vapor deposition (LPCVD). Thickness of the polysilicon layer will depend on the ultimate characteristics of the transistor to be formed. In one embodiment, the thickness of the polysilicon layer may be about 150 to 200 nm.

Figure 2:
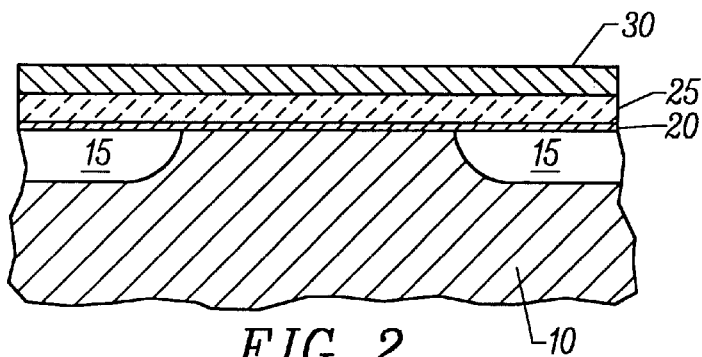

FIG. 2 shows a silicon oxinitride layer ($SiO_xN_y$, where x and y are integers), formed on the top surface of polysilicon layer 25. Silicon oxinitride layer 30, as will be described below, serves as a bottom anti-reflective layer used in the lithography processing of polysilicon layer 25. Silicon oxinitride layer 30 is deposited by any of a number of conventional chemical vapor deposition (CVD) or other techniques to have a resulting thickness of about 110 nm.

Figure 3:
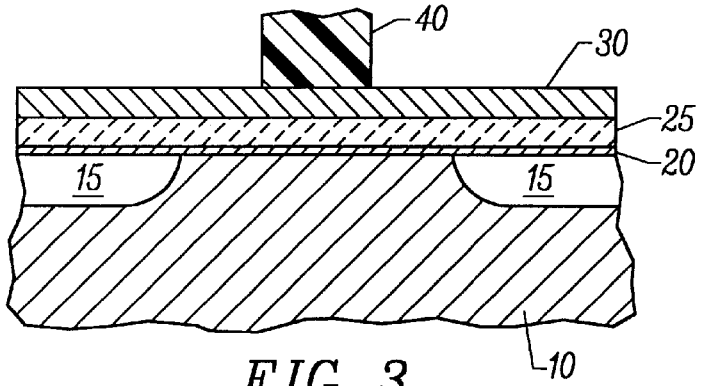

As shown in FIG. 3, a photoresist mask layer 40 is deposited over the top surface of silicon oxinitride layer 30. The photoresist layer 40 may be any of a number of conventional photoresist materials. Photoresist layer 40 is then patterned using a conventional mask exposure and development process to leave a portion 42 of the layer overlying the top surface of silicon oxinitride 30. Silicon oxinitride layer 30 is then etched using a selective etch process to leave portion 32 of silicon oxinitride layer 30 on polysilicon layer 25. The selective etch step is typically performed by plasma etching.

Figure 4:
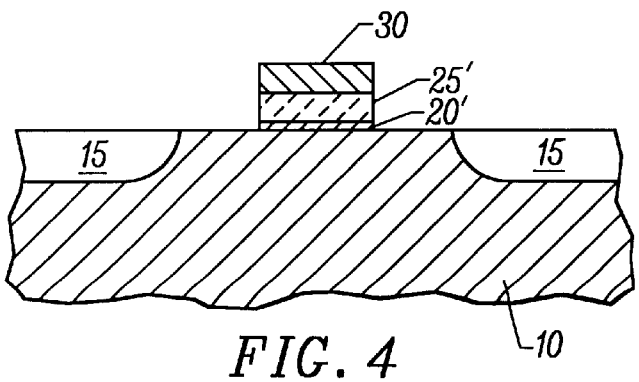

Subsequently, as shown in FIG. 4, polysilicon layer 25 and gate oxide layer 20 are etched using a directional dry etch process to leave a gate stack 50 on substrate 10.

FIGS. 5 through 9 illustrate a first embodiment of the present invention wherein an angled implant is utilized to form an asymmetric channel device in accordance with the method and apparatus of the present invention.

The implant utilized in the present invention is designed to adjust the threshold voltage ($V_t$) of the transistor. In the present invention, the angle of incidence of the dopant during the implantation stage is at a generally higher angle than that used in the prior art and limited by a photoresist mask, as described below.

Figure 5:
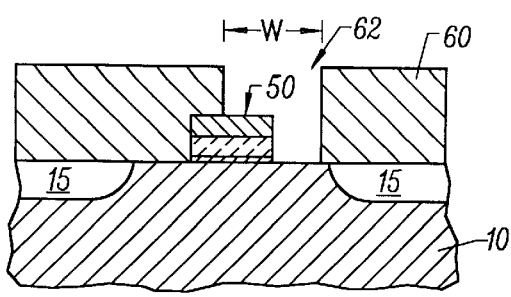
Figure 9:
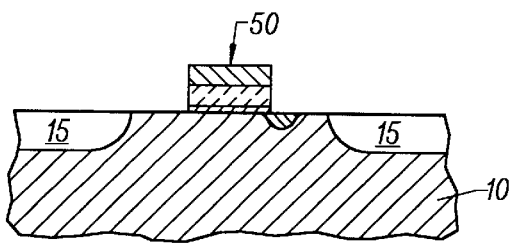
FIGS. 9 through 12 illustrate a second embodiment of the present invention for forming source and drain regions in an asymmetric channel device in accordance with the method and apparatus of the present invention.

FIG. 5 shows a second photoresist mask 60 applied over the surface of substrate 10 and gate stack 50. Photoresist mask 60 may be any of a number of conventional photoresist chemistries. Mask 60 in subsequent portions of the process of the invention acts as a shield for the threshold voltage implant.

Figure 6:
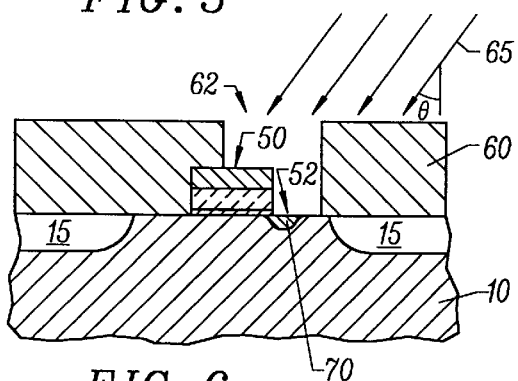

FIG. 6 illustrates an angled implantation step 65 in accordance with the present invention. Angled implant 65 comprises, for example boron ions at an energy of 20–90 KeV at an angle θ in the range of 5–40° and in one embodiment, a range of about 20–25°, to define a concentration of $5 \times 10^{12}$–$1.5 \times 10^{13}$ atm/cm.² in a region 70 adjacent to gate stack 50.

An opening 62 is formed in photoresist mask 60 which is critical to the implantation step of the present invention. In particular, opening 62 has a width W which defines the maximum angle of incidence of the implant 65. The opening 62 starts on top of polysilicon gate stack and has a width W of approximately 0.25–0.6 micrometers. The smaller the opening, the higher the angle of incidence of the implant, and the much lower junction capacitance the resulting device will have, since the implant will only be into the region of the channel allowed by opening 62. The angle of incidence and the width W of the opening will be dependent upon the resultant channel length and threshold voltage one desires for the device.

As will be readily understood with reference to FIG. 6, the angle of incidence θ of implant 65 will result in some of the dopant material at region 70 stretching under edge 52 of gate stack 50. Likewise, some of the dopant in implant 65 will penetrate through the side of polysilicon gate layer 25 and gate oxide layer 20 and result in the distribution spectrum roughly shown as an inverted bell shape for region 70.

In further contrast to the prior art, the silicon nitride layer 32 on the gate stack 50 protects the polysilicon gate layer 25 from most of the dopant in angled implant 65. In this first embodiment of the invention, the angled implant 65 is contemplated as being a drain side implant, and the source region remains to be formed, as discussed below.

It should be further recognized that the substrate may be rotated up to three times (for a total of four device orientations) relative to the implant angle to provide angled implants as necessary relative to gate structures of devices being formed on other portions of substrate 10. For example, an implant at an angle θ for a first set of devices having a first given orientation with respect to the substrate, as shown in the figures, followed by rotation of 180° to implant devices that have drains on the left side of the device as well as those that have drains on the right side of the device (as shown in the figures). In addition, rotating the wafer at 90° and 27° with respect to the initial orientation allows implanting devices formed vertically with respect to the orientation shown in the Figures. In the case of rotation of the wafer at 90° and 270°, a second angled implant mask layer (not shown) which, viewed in cross-section, would appear the same as mask 60 in FIG. 6, would be used to mask the vertically-oriented devices.

Once region 70 has been formed in the substrate, at least two alternatives exist for forming the asymmetric transistor in accordance with the present invention. A first alternative is shown in FIGS. 7 and 8.

Figure 7:
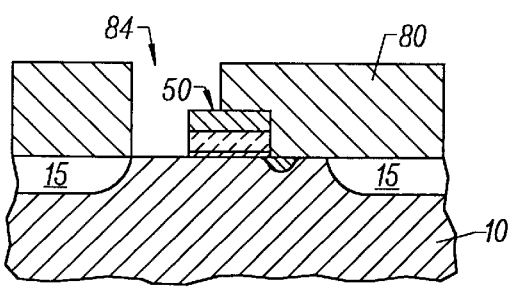
FIGS. 7 and 8 illustrate a first embodiment of the present invention for forming source and drain regions in accordance with the present invention.
Figure 8:
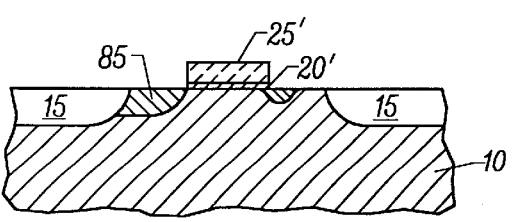

In FIG. 7, a third photoresist mask layer 80 is deposited over the surface of the substrate 10. Photoresist mask layer 80 may be patterned in accordance with well-known photolithography techniques to form an opening 84 over the source region of the device. A conventional vertical implant may then be used at an incidence normal to the surface of substrate 10 to form a deep source region 85 in substrate 10. The resulting device, shown in FIG. 8, has very low source-side capacitance.

An alternative embodiment of the method and apparatus of present invention is shown in FIGS. 9–12. At the completion of implantation step 65 (discussed with respect to FIG. 6), mask 60 is removed leaving the structure shown in FIG. 9.

Figure 10:
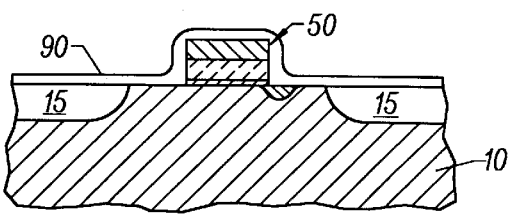

In FIG. 10, a thin conformal spacer layer 90 of an insulator material, which may comprise an oxide, oxinitride, or silicon nitride, is formed over the surface of substrate 10 and gate stack 50. Preferably, the spacer layer 90 is a silicon oxinitride ($SiO_xN_y$), which is deposited by a conformal deposition process.

Spacer layer 90 is then etched to form spacers 92, 94 adjacent to gate stack 50. These spacers, as will be recognized to one of average skill in the art, are similar to those made when forming a symmetrical channel device but are relatively thin since they are formed with the silicon nitride layer 30 on the gate stack. The etch utilized to form spacers 92, 94 will remove nitride layer 30.

Figure 11:
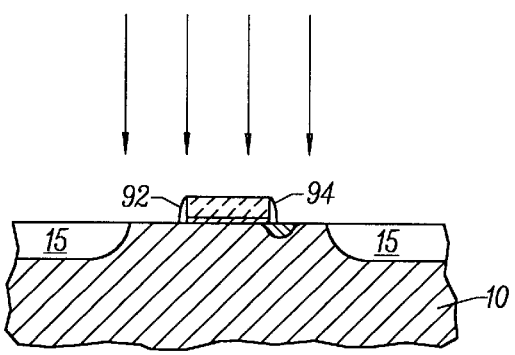

As illustrated in FIG. 11, subsequent source/drain implant 100 is made into the substrate 10. Source/drain implant 100 may be an implant of arsenic at, for example, an energy of 2.5 to 10 KeV to form regions 110, 112 having a concentration of $2.0 \times 10^{20}$ atm/cm$^3$ to a junction depth of 0.05–0.15 μm for the source and drain, respectively, of the device. The resulting structure shown in FIG. 12 has an extremely low capacitance on the source side 110 of the device. Capacitance on the dopant side is extremely low on the order of 0.1 fF/μm.

Threshold voltage control is achieved in the device of the present invention through the angled implant. In the *Odanaka* reference, the authors limit their discussion of the angled implant to the source side of the device only. Further, the angle of incidence is 7°. In addition, *Odanaka* does not use the silicon oxinitride layer as a mask step.

Figure 12:
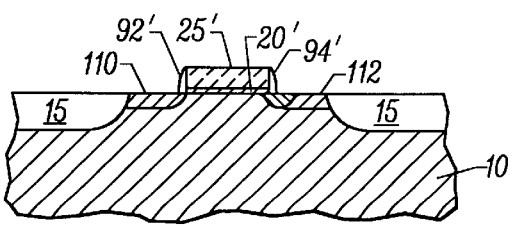

As shown in FIG. 12, the silicon oxinitride layer can be removed after the implantation of the source 110 and drain 112 regions.

It should be recognized that in the first embodiment of the present invention, masking of the drain side of the transistor need not be performed. Moreover, in an alternative embodiment, the implant used to form the source region may be simultaneously utilized to form a deeper drain region, if desired.

Furthermore, as should be recognized with respect to the first embodiment of the present invention, a single drain side mask may be utilized and the device rotated three times, or two different masks, one for the 0° and 180° rotation, and another for the 90° and 270° rotations, may be utilized in accordance with the teachings of the present invention.

FIGS. 13 through 17 show yet another alternative embodiment of the present invention. In this embodiment, rather than using two masks for the source side and drain side implants, only a single mask (per orientation) is used.

Figure 13:
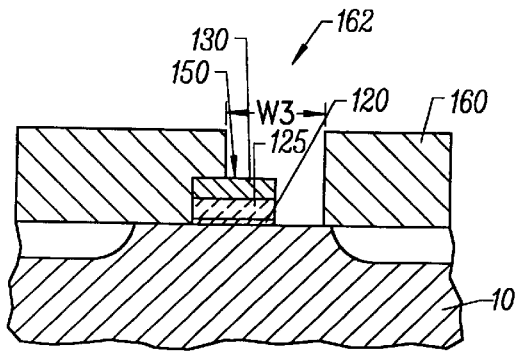
FIGS. 13 through 17 illustrate yet another alternative embodiment of the present invention.

FIG. 13 shows a gate stack 150 formed in a manner similar to gate stack 50 discussed above. The gate stack 150 includes a gate oxide layer 120, a polysilicon gate, and an oxinitride layer 130. Mask layer 160 is applied over the surface of substrate 10, and an opening 162 formed therein having a width $W_3$.

Figure 14:
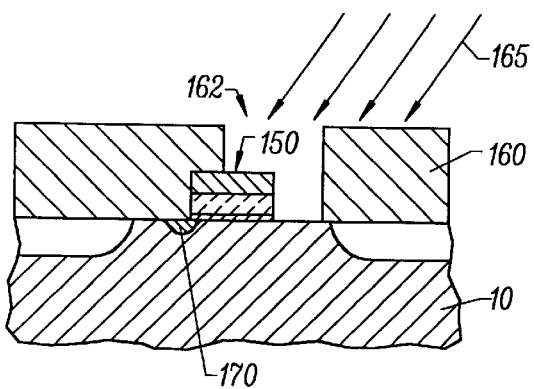

As shown in FIG. 14, a first angled implant of boron at an energy of approximately 70 to 100 KeV at an angle in a range of 20°–30° relative to a line normal to the substrate 10 to form a region 170 having a concentration of $1 \times 10^{13}$–$1.5 \times 10^{13}$ atm/cm$^2$ is performed. In contrast to the method discussed above with respect to FIGS. 5 through 8, this implant is performed on the eventual source side of the device, and the angle of implantation is selected so that the majority of the dopant penetrates and passes through the polysilicon gate 125 to form region 170 on a side 151 of gate structure 150 which is covered by photoresist layer 160, which will eventually form the drain side of the device.

Figure 15:
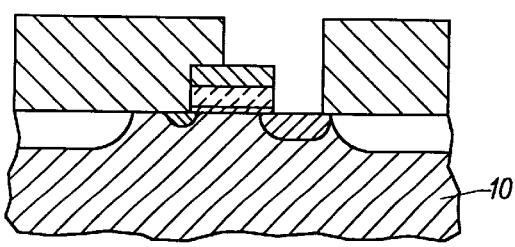

Subsequently, as shown in FIG. 15, and using the same mask 160, a source side implant of, for example, arsenic, at, for example, an energy in the range of $5.0 \times 10^{14}$ to $4.0 \times 10^{15}$ atm/cm$^2$ at an energy of 2 to 5 KeV at a tilt angle θ of 0° performed to implant source region 185. In accordance with this embodiment of the present invention, a single photoresist mask layer 162 is used for the implants in both the drain region and the source region.

Figure 16:
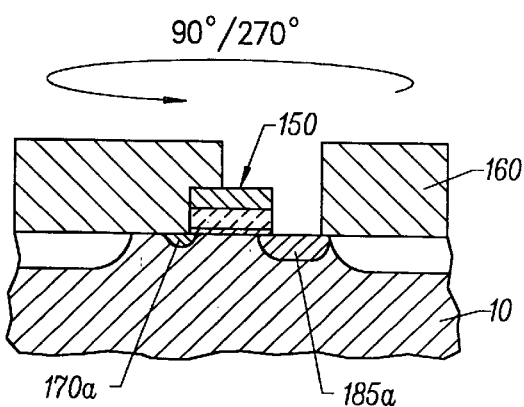

As in previous embodiments, and as illustrated in FIG. 16, substrate 10 may thereafter be rotated and a second mask 160a applied to form vertically oriented devices, in accordance with the present invention. In this case, only one mask per orientation is required for forming each device.

The above-mentioned implants 165 and 175 may be repeated after a rotation of the substrate and performed for such vertically oriented devices.

Figure 17:

Finally, once both horizontally and vertically oriented devices have been implanted, subsequent implant steps may be performed, if desired. Such a sequence is illustrated in FIG. 17, wherein resist spacers 192 and 194 are thereafter formed adjacent to gate stack 150 in the manner described with respect to the embodiment discussed in FIGS. 10 through 12. Subsequently, source and drain implant regions 210, 212 may be formed in accordance with the manner described above with respect to FIGS. 9 through 12: a single source/drain implant 180 of an arsenic impurity at an energy of 5 to 10 KeV at an angle normal ($\theta=0°$) to the surface of the substrate to form a regions 210, 212 having a concentration of $1.0\times10^{15}$ to $4.0\times1^{15}$ atm/cm$^2$.

The many features and advantages of the present invention should be apparent to one of average skill in the art. In particular, threshold voltage control of an extremely short channel transistor (low 0.15 micrometers) can be achieved using the asymmetric channel implant discussed herein. Moreover, the invention utilizes a photoresist mask during the implantation step to provide for a confined angled implant region, and to adjust for the maximum allowable angle of incidence of the implant.

Numerous modifications to the method of the present invention should be apparent to one of average skill. By way of example and without limitation, one could utilize a punch-through stop implants disclosed with respect to the prior art in conjunction with the method of the present invention. These standard well implants utilized with symmetrical channel devices may be utilized where off-state leakage of the device is of concern.

These and other advantages and modifications of the present invention will be apparent to one of average skill in the art. All such features, advantages and modifications are intended to be within the scope of the invention as specified herein and as defined by the following claims.

What is claimed is:

1. A method of forming a semiconductor apparatus, comprising:
    (A) providing a semiconductor substrate;
    (B) forming a gate stack on the surface of the substrate, the gate stack having at least a source side and a drain side, and a channel region under the gate stack between the source side and the drain side;
    (C) forming a mask layer over the surface of the substrate and a portion of the gate stack, the mask layer having an opening over a portion of the gate stack on the drain side of the gate stack;
    (D) implanting an impurity into the substrate at an angle relative to a line normal to the surface of the substrate in a range of about 5–40 degrees into a portion of the channel region to form a device threshold control sub-region in the channel region at a first impurity concentration;
    (E) forming a second mask layer over the surface with an opening over a portion of the substrate adjacent to the source side of the gate stack and a portion of the gate stack; and
    (F) implanting an impurity into the substrate along a path normal to the surface of the substrate to form at least a source region having a second impurity concentration greater than the first impurity concentration.

2. The method of claim 1 wherein the step (D) results in a device threshold control sub-region having a concentration of $5\times10^{12}$–$1.5\times10^{13}$ atm/cm$^2$.

3. The method of claim 1 wherein the step (D) results in an implant region having a junction depth of about 1.5 to 3.0 nm.

4. The method of claim 1 further including the steps of:
    prior to said step (E), depositing a conformal layer over the surface of the substrate and the gate stack, and etching the conformal layer to form spacers; and
    wherein said step (F) comprises implanting source and drain regions into the substrate by implanting an impurity into the substrate along a path normal to the surface of the substrate.

5. The method of claim 1 wherein the gate stack comprises a gate oxide layer and a polysilicon layer.

6. The method of claim 1 wherein said step (B) comprises the sub-steps of:
    (1) heating the substrate in an oxygen-containing atmosphere to form an oxide having a thickness in a range of about 1.5 to 3.0 nm; and
    (2) depositing a polysilicon layer over the surface of the gate oxide layer by chemical vapor deposition.

7. The method of claim 1 wherein said step (B) comprises:
    (1) growing a gate oxide layer on the surface of the substrate;
    (2) depositing a polysilicon layer on the surface of the substrate;
    (3) depositing an oxinitride layer on the surface of the polysilicon layer; and
    (4) etching the oxinitride layer, polysilicon layer, and gate oxide layer.

8. The method of claim 1 further including the steps of:
    (E) rotating the substrate 180°; and
    (F) implanting the impurity into the substrate at an angle relative to a line normal to the surface of the substrate in a range of about 5–40 degrees.

9. The method of claim 1 further including the steps of:
    (E) rotating the substrate 180°;
    (F) implanting the impurity into the substrate at an angle relative to a line normal to the surface of the substrate in a range of about 5°–40°;
    (G) forming a vertical device implant mask layer over the surface of the substrate and a portion of the gate stack, the mask layer having an opening over a portion of the gate stack on a second side of the gate stack;
    (H) rotating the substrate 90°;
    (I) implanting the impurity into the substrate at an angle relative to a line normal to the surface of the substrate in a range of about 5°–40°;
    (J) rotating the substrate 180°; and
    (K) implanting the impurity into the substrate at an angle relative to a line normal to the surface of the substrate in a range of about 5°–40°.

10. The method of claim 1 wherein said step of implanting is of an energy and angle sufficient for the impurity to penetrate the gate stack and form the threshold control sub-region adjacent to the second side of the gate stack, the method further including the steps of:
    (G) rotating the substrate 90°;
    (H) forming a vertical device implant mask layer over the surface of the substrate and a portion of a second gate stack, the mask layer having an opening over a portion of the second gate stack on a source side of the second gate stack;
    (I) implanting the impurity into the substrate at an angle relative to a line normal to the surface of the substrate in a range of about 5°–40° at an energy and angle sufficient for the impurity to penetrate the second gate stack and form an impurity region on a second side of the second gate stack; and
    (J) implanting an impurity into the substrate along a path normal to the surface of the substrate to form a source region on the first side of the second gate stack.

11. A method of forming a semiconductor apparatus on a semiconductor substrate, the semiconductor substrate having a surface, comprising the steps of:
    (A) forming a gate stack on the surface of the substrate, the gate stack having a barrier layer of material overlying the gate stack, a source side, and a drain side;

(B) forming a mask layer over the surface of the substrate and a portion of the barrier layer, the mask layer including an opening having a width positioned over at least a portion of the drain side of the gate stack;

(C) implanting an impurity into the substrate through said opening at an angle relative to a line normal to the surface of the substrate in a range of about 5–40 degrees, the angle being selected based on the width of the opening to form a device threshold control sub-region underlying the gate stack, the region having a first impurity concentration;

(D) forming a second mask layer on the surface of the substrate, the mask layer having an opening on a second side of the gate stack; and (E) implanting an impurity into the substrate along a path normal to the surface of the substrate to form at least a source region in the substrate at a second impurity concentration greater than said first concentration.

12. The method of claim 11 wherein said step (A) comprises the sub-steps of:

(1) forming a gate oxide on the surface of the substrate;

(2) forming a polysilicon layer on the surface of the gate oxide;

(3) depositing an oxinitride layer on the surface of the polysilicon layer; and (4) etching the oxinitride layer, polysilicon layer, and gate oxide layer.

13. The method of claim 11 wherein said step (C) comprises implanting boron at an energy of approximately 20–90 keV to form the sub-region having a concentration of $5 \times 10^{12} – 1.5 \times 10^{13}$ atm/cm$^2$.

14. The method of claim 11, further including the steps of:

prior to said step (D), forming a conformal silicon nitride layer over the surface of the gate stack and the surface of the substrate, and etching the silicon nitride layer to form spacers.

15. The method of claim 11 further including the steps of:

(F) rotating the substrate 180°; and (G) implanting the impurity into the substrate at an angle relative to a line normal to the surface of the substrate in a range of about 5°–40°degrees.

16. The method of claim 14 further including the steps of:

(F) rotating the substrate 180°;

(G) implanting the impurity into the substrate at an angle relative to a line normal to the surface of the substrate in a range of about 5°–40°;

(H) forming a vertical device implant mask layer over the surface of the substrate and a portion of the gate stack, the mask layer having an opening over a portion of the gate stack on a second side of the gate stack;

(I) rotating the substrate 90°;

(J) implanting the impurity into the substrate at an angle relative to a line normal to the surface of the substrate in a range of about 5°–40°;

(K) rotating the substrate 180°; and (L) implanting the impurity into the substrate at an angle relative to a line normal to the surface of the substrate in a range of about 5°–40°.

17. A process, comprising:

(A) providing a semiconductor substrate;

(B) forming a gate oxide on the surface of the substrate;

(C) forming a polysilicon layer on the gate oxide (D) forming a layer of silicon nitride on the surface of the polysilicon layer;

(E) etching portions of the silicon nitride layer to leave a portion of the silicon nitride layer overlying the polysilicon layer;

(F) etching the polysilicon layer and the gate oxide layer using the portion of the silicon nitride layer as a mask to define a gate stack having a channel region thereunder;

(G) forming a first implant mask over the surface of the substrate, the implant mask having an opening at a drain side of the gate stack;

(H) implanting an impurity at an angle in a range of 5–40 degrees relative to a line normal to the surface of the semiconductor substrate to form a threshold control region in the channel region;

(I) forming a second implant mask over the surface of the substrate, the implant mask having an opening over at least a source side of the gate stack; and (J) implanting an impurity at an incidence normal to the surface of the substrate into the substrate at at least the source side of the gate stack.

18. A method of forming a semiconductor apparatus on a semiconductor substrate, the semiconductor substrate having a surface, comprising the steps of:

(A) forming a gate stack on the surface of the substrate, the gate stack having a barrier layer of material overlying the gate stack and a channel region underlying the stack;

(B) forming a mask layer over the surface of the substrate and a portion of the barrier layer, the opening having a width; and (C) implanting an impurity into the substrate at an angle relative to a line normal to the surface of the substrate in a range of about 5–40 degrees, the angle being selected based on the width of the opening so as to implant the impurity through the gate stack into the channel region to form a threshold control region having a first impurity concentration in a sub-region of the channel region adjacent to a first side of the gate stack; and (D) implanting a second dose of the impurity into the substrate at an angle normal to the surface of the substrate through said opening to form a source region on a second side of the gate stack.

19. The method of claim 18 wherein the method further includes the steps of:

(E) rotating the substrate 90°;

(F) forming a vertical device implant mask layer over the surface of the substrate and a portion of a second gate stack, the mask layer having an opening over a portion of the second gate stack on a first side of the second gate stack;

(G) implanting the impurity into the substrate at an angle relative to a line normal to the surface of the substrate in a range of about 5°–40° at an energy and angle sufficient for the impurity to penetrate the second gate stack and form a region on a second side of the second gate stack; and (H) implanting an impurity into the substrate along a path normal to the surface of the substrate to form a source region on the first side of the second gate stack.

* * * * *